United States Patent [19]
Kopley et al.

[11] Patent Number: 6,028,803
[45] Date of Patent: Feb. 22, 2000

[54] READ AMPLIFIER FOR SEMICONDUCTOR MEMORY CELLS WITH MEANS TO COMPENSATE THRESHOLD VOLTAGE DIFFERENCES IN READ AMPLIFIER TRANSISTORS

[75] Inventors: Thomas Kopley, Los Altos Hills, Calif.; Werner Weber, München; Roland Thewes, Gröbenzell, both of Germany

[73] Assignee: Siemens Aktiengesellschaft, Munich, Germany

[21] Appl. No.: 09/180,665

[22] PCT Filed: May 21, 1997

[86] PCT No.: PCT/DE97/01027

§ 371 Date: Nov. 12, 1998

§ 102(e) Date: Nov. 12, 1998

[87] PCT Pub. No.: WO97/47010

PCT Pub. Date: Dec. 11, 1997

[30] Foreign Application Priority Data

May 30, 1996 [DE] Germany .................. 196 21 769

[51] Int. Cl.[7] ............................................ G11C 7/02
[52] U.S. Cl. ................... 365/208; 365/207; 365/205
[58] Field of Search ............................. 365/207, 208, 365/190, 205

[56] References Cited

U.S. PATENT DOCUMENTS

| | | | |
|---|---|---|---|
| 3,879,621 | 4/1975 | Cavaliere et al. | 365/207 |
| 4,238,841 | 12/1980 | Clement et al. | 365/205 |
| 4,858,195 | 8/1989 | Soneda . | |
| 4,879,684 | 11/1989 | Krauss et al. | 365/189.11 |
| 5,023,841 | 6/1991 | Akrout et al. | 365/205 |
| 5,333,121 | 7/1994 | Geib | 365/205 |
| 5,859,794 | 1/1999 | Chan | 365/149 |

FOREIGN PATENT DOCUMENTS

| | | |
|---|---|---|
| 0 549 623 B1 | 7/1993 | European Pat. Off. . |
| WO 80/01730 | 8/1980 | WIPO . |
| WO 92/05557 | 4/1992 | WIPO . |

OTHER PUBLICATIONS

IEEE Journal of Solid–State Circuits, vol. SC–14, No. 6, Dec. (1979), S. Suzuki et al, "Threshold Difference Compensated Sense Amplifier", pp. 2066–1070.

IEEE publication IEDM (1981), T. Furuyama et al, "A New Sense Amplifier Technique for VLSI Dynamic RAM's", pp. 47–44.

Primary Examiner—David Nelms
Assistant Examiner—Gene N. Auduong
Attorney, Agent, or Firm—Hill & Simpson

[57] ABSTRACT

In the read amplifier a mismatch of the inception voltages of cross-coupled transistors (M5, M6) of the read amplifier are compensated by four further transistors (M1 . . . M4), whereby a defined equalizing of the bitlines advantageously takes place with these further transistors simultaneously in what is called the equalize phase. The compensation takes place in that the bitline that is connected with the transistor with the lower inception voltage is charged to a higher level in the pre-load phase. This higher bitline level is switched to the gate of the transistor connected with the other bitline. In the evaluation phase the transistor with the higher inception voltage becomes more strongly conductive. Read amplifiers of this sort are most significant for memory generations beginning at 1 Gbit, since the mismatch due to the variation of the input voltages of the transistors can no longer usefully be solved by a correspondingly large gate surface of the cross-coupled transistors in the read amplifier.

4 Claims, 4 Drawing Sheets

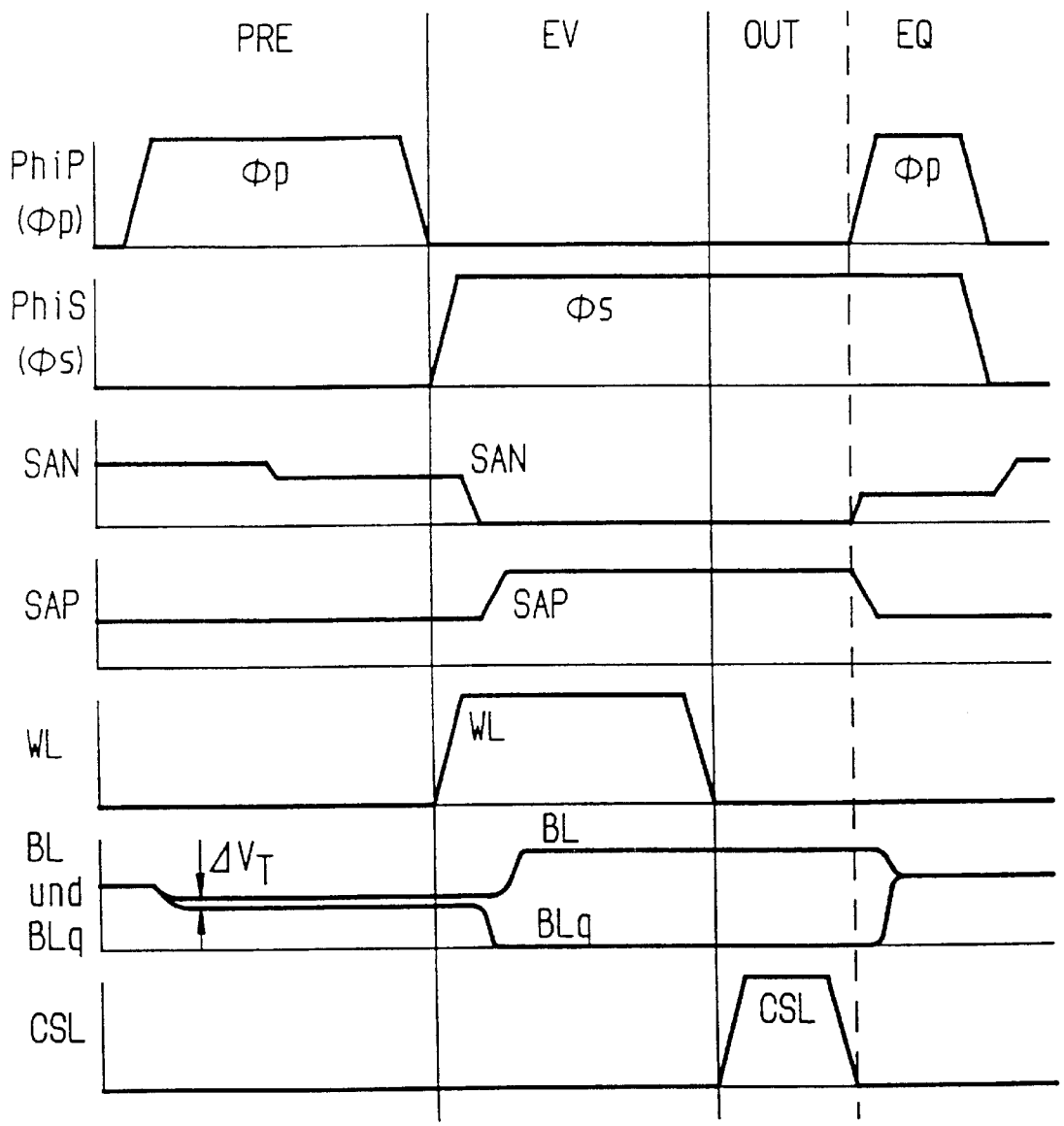

READ AMPLIFIER FOR SEMICONDUCTOR MEMORY CELLS WITH MEANS TO COMPENSATE THRESHOLD VOLTAGE DIFFERENCES IN READ AMPLIFIER TRANSISTORS

BACKGROUND OF THE INVENTION

European reference 0 549 623 B1, or respectively, from the corresponding U.S. Pat. No. 5,333,121, a read amplifier according to the preamble of patent claim 1 is known.

In future DRAM memory generations with a memory capacity of 1 Gbit and more, problems with the mismatch of transistors will increase considerably. In principle, variations in the inception voltage and in the drain current are thereby involved, whereby the first make up approx. 65 to 100 percent of the overall effect. The variations in the inception voltage are proportional to $1/\sqrt{\text{gate surface}}$, and consequently increase as the transistor surfaces decrease. The degree of agreement of two transistors required in read amplifiers thus necessarily becomes increasingly worse as progress is made in miniaturization. Previously, the problem was solved above all by increasing the surface of the cross-coupled transistors present in the read amplifier. This procedure will presumably come to an end with 4 GBit memories at the latest, because there the surface required for the cross-coupled transistor pair of the read amplifier exceeds 25 percent of the overall chip surface due to the mismatch problem alone.

From the IEEE Journal of Solid-State Circuits, vol. SC-14, no. 6, December 1979, pages 1066 to 1070, a read amplifier is known that comprises a means for compensation of threshold voltage differences with four MOS transistors. However, this circuit has for example the disadvantage that its compensation effect depends on a relation of circuit-internal capacitors, and remains incomplete.

From the IEEE publication IEDM 1981, pp. 44–47, a read amplifier is known that requires an additional transistor for equalizing the bitlines, and requires an additional connection line for the supply voltage.

SUMMARY OF THE INVENTION

The underlying object of the invention is to indicate a semiconductor memory with a read amplifier in which the above named disadvantages are avoided.

In general terms the present invention is a semiconductor memory with a read amplifier. The read amplifier is connected with a bitline pair, whereby a first bitline of the bitline pair is connected with a memory cell and a second bitline represents a comparison line. Two cross-coupled MOS transistors form a holding element. These MOS transistors respectively form a first terminal that is connected with an activation input of the read amplifier. A second terminal of a first of these two MOS transistors is connected with the first bitline and a second terminal of a second of these two MOS transistors is connected with the second bitline. Two additional MOS transistors have gates connected with a first control line. A respective first terminal of these two additional MOS transistors is respectively connected with one of the gates of the cross-coupled MOS transistors. The gate of the first of the cross-coupled MOS transistors can be connected with the second bitline via a first further MOS transistor. The gate of the second cross-coupled MOS transistor can be connected with the first bitline via a second further MOS transistor. The gates of the two further MOS transistors are connected in common with a second control line. The additional MOS transistors has second terminals that are connected in common with the activating input of the read amplifier.

Advantageous developments of the present invention are as follows.

The two additional MOS transistors and the two further MOS transistors are all n-channel MOS transistors.

The two cross-coupled MOS transistors are n-channel MOS transistors in one embodiment, and in another embodiment the two cross-coupled MOS transistors are p-channel MOS transistors.

A particular advantage of the invention is that by means of a corresponding control unit, the four additional transistors can also be used as an equalizing means (equalize) for the two bitlines, and thus only one additional transistor is required in relation to conventional read amplifiers.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 4 shows a time diagram of the signals used in FIG. 3.

DESCRIPTION OF THE PREFERRED EMBODIMENTS

Figure 1:
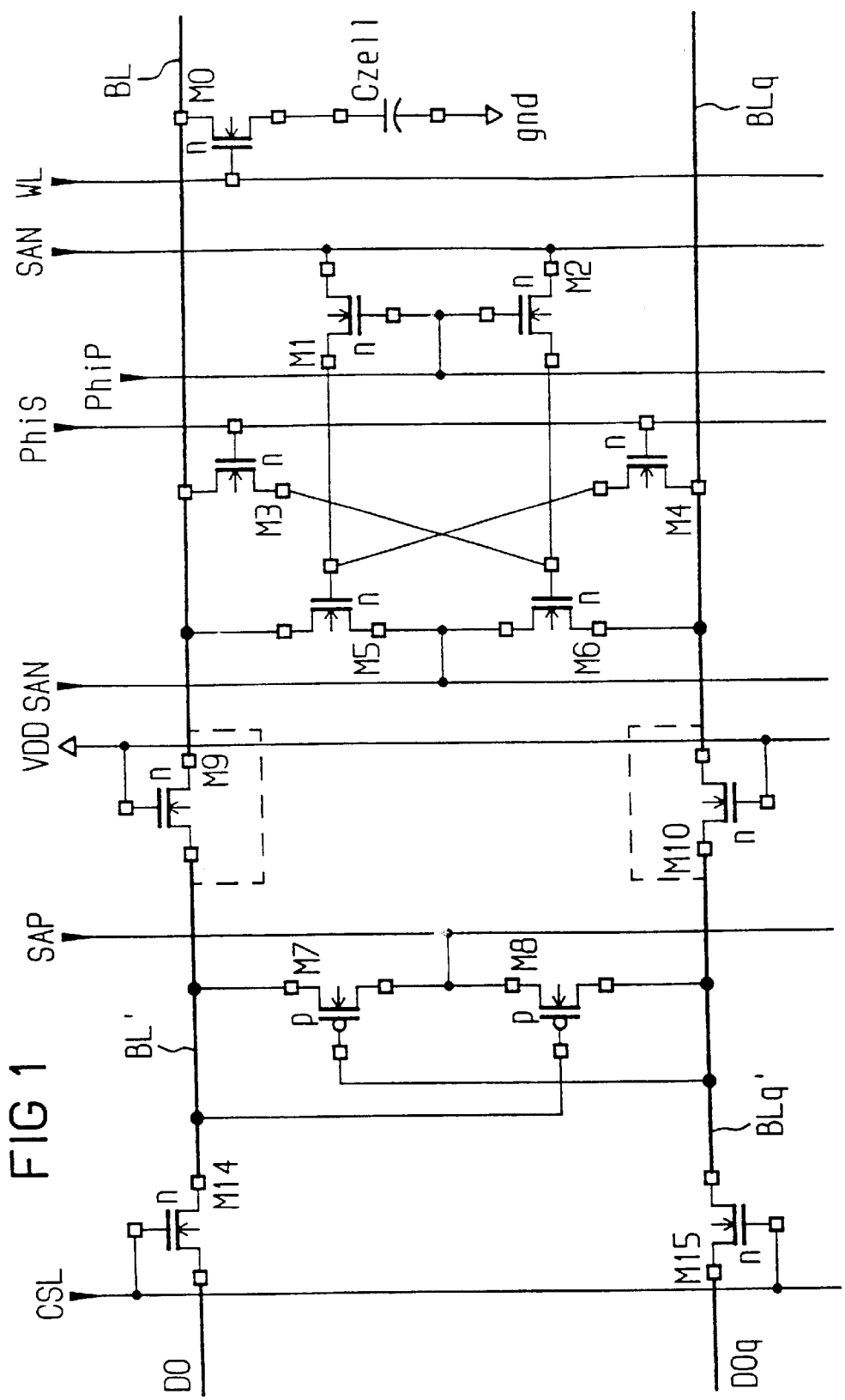
FIG. 1 thereby shows a switching diagram of a first embodiment of the invention.

In FIG. 1, an inventive read amplifier is shown that is connected with a bitline pair consisting of the bitlines BL and Blq, and that comprises both what is known as an SAP part and also what is known as an SAN part. The bitlines BL' and Blq' of the SAP part and the bitlines BL and Blq of the SAN part are thereby, as is shown in broken lines, connected with one another either directly or else via MOS transistors M9 and M10 that are inserted into the bitlines and are switched as resistors, whereby the gate terminals of the transistors M9 and M10 are for example connected to the supply voltage VDD. The bitline pair of the SAP part can be connected through to the gates of these two transistors on a data line pair D0 and D0q, for example via MOS transistors M14 and M15, dependent on a column selection signal CSL. The bitline BL of the SAN part of the inventive read amplifier is connected with the memory cell, whereby the bitline BL is connected with a first terminal of a cell transistor M0, whose gate is connected with a wordline WL, and whose second terminal is applied to reference potential gnd via a cell capacitor $C_{zell}$. The SAP part of the read amplifier comprises two cross-coupled p-channel MOS transistors M7 and M8, whereby a first terminal of the transistor M7 is connected with the bitline BL', the gate terminal of the transistor M7 is connected with the bitline Blq', and the second terminal of the transistor M7 is connected with a first terminal of the transistor M8, whose gate terminal is connected with the bitline BL' of the SAP bitline pair and whose second terminal is connected with the bitline Blq'. An SAP activation signal SAP is supplied to the connection node between the two transistors M7 and M8. The SAN part of the inventive read amplifier comprises two cross-coupled n-channel MOS transistors M5 and M6, whereby a first terminal of the transistor M5 is connected with the bitline BL, the gate terminal of the transistor M5 is connected with the bitline Blq via a further n-channel MOS transistor M4, and the second terminal is connected with a first terminal of the transistor M6, whose gate terminal is connected with the bitline BL via a second further transistor M3 and whose second terminal is connected with the bitline Blq. The gates of the transistors M3 and M4 are connected with a first control line PhiS, and an SAN activation signal SAN is supplied to the connection node of the two transistors M5 and M6. Via a first additional n-channel MOS transistor M1, the SAN activation signal can be supplied to the gate of the transistor M5, and via a second additional n-channel MOS transistor M2 the SAN activation signal can be supplied to the gate of the transistor M6, whereby the gates of the transistors M1 and M2 are connected with the control line PhiP.

Figure 2:
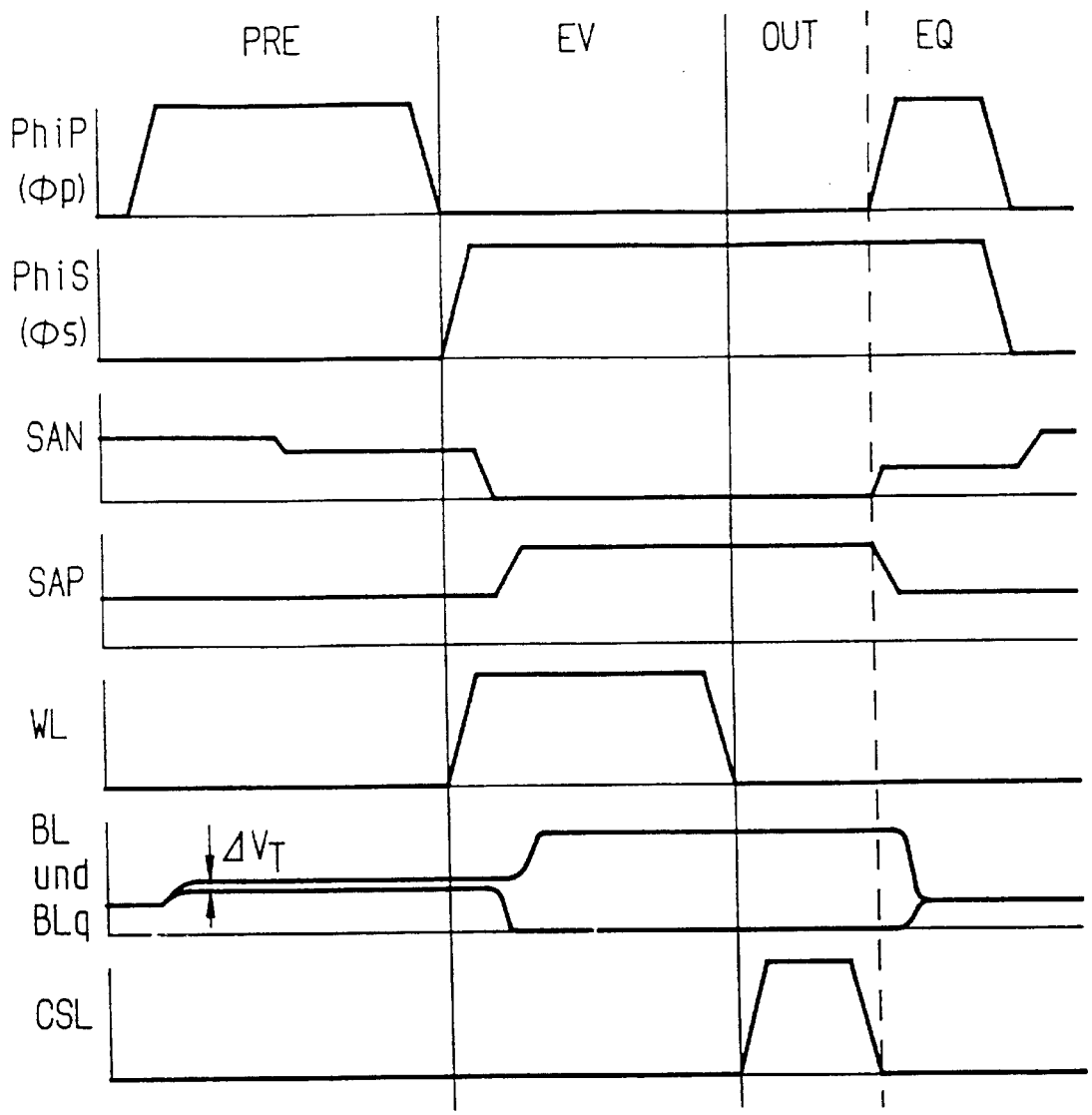
FIG. 2 shows a time diagram of the signals used in FIG. 1.

FIG. 2 shows a time diagram for the control signals PhiP and PhiS, the activation signals SAN and SAP, the signal on the wordline WL, the signals of the bitline pair BL and Blq, and the column selection signal CSL during a pre-load phase PRE, an evaluation phase EV, an output phase OUT and an equalizing phase EQ. During the pre-load phase PRE and the equalizing phase, in which the bitlines of the bitline pair are applied to the same potential, the control signal PhiP has high potential, and otherwise has low potential. The control signal PhiS has high potential except for the pre-load phase PRE. The SAN activation signal decreases to low potential in steps within the pre-load phase and at the beginning of the evaluation phase, and within the equalizing phase EQ increases again to high potential. Within the pre-load phase, and at the beginning of the evaluation phase, until the SAN activation signal is at low potential, the SAP activation signal has a mean level of e.g. VDD/2, and for the remaining part of the evaluation phase Ev and during the output phase has the high level, and within the equalizing phase EQ falls again to the mean level VDD/2. The wordline WL receives the high level only within the evaluation phase EV, and otherwise has the low level. The levels of the bitlines BL and BLq are approximately VDD/2 within the pre-load phase and at the beginning of the evaluation phase, after the control signal PhiP has the high level, and differ by the threshold voltage difference AVT, due to the transistor mismatch. Within the further evaluation phase and the output phase, the bitline BL has the high level, and the bitline Blq has the low level, if the cell to be evaluated has been loaded. For the case in which the cell has not been loaded, the bitline levels are correspondingly exchanged. Within the equalizing phase EQ, the bitlines BL and Blq have the same potential. The column selection signal CSL is at high level only in the output phase OUT.

In the pre-load phase PRE, the two bitlines have the same level of zero up to a maximum of $VDD/2-V_{t,max}$, whereby $V_{t,max}$ represents the maximum possible inception voltage of the cross-coupled transistors. Given a deactivated control signal PhiS, PhiP is now switched to a high level of e.g. VDD, whereby the two transistors M1 and M2 become conductive, while the transistors M3 and M4 block. The level of the SAN selection signal is thereby approx. $VDD/2+V_{t,max}$, and is switched by the transistors M1 and M2 to the gates of the cross-coupled transistor pair M5 and M6. The two gate levels are exactly equal, since no direct current flows through the transistors M1 and M2, which are possibly not exactly equal. Since by means of the SAN activation signal the node between the transistors M5 and M6 is charged to the potential $VDD/2+V_{t,max}$, there arises on the bitline BL a potential of $VDD/2+V_{t,max}-V_{t,M5}$, and on the bitline Blq there arises a potential of $VDD/2+V_{t,max}-V_{t,M6}$. The voltage difference $\Delta V_{BL-BLq}$ then corresponds precisely to the difference of the inception voltages of the two cross-coupled transistors M5 and M6. At the end of the pre-load phase PRE, the voltage of the SAN activation signal is reduced by a mean inception voltage of the two transistors M5 and M6, whereby almost equal levels are achieved at the bitlines BL and Blq or, respectively, at the gates of the transistors M5 and M6. During the following evaluation, in this way no charge can flow from the two gates of the transistors M5 and M6 to the bitlines BL and Blq.

In the evaluation phase EV, the signal PhiP is applied to low potential, and the control signal PhiS is for example raised to VDD, so that the transistors M1 and M2 block, while the transistors M3 and M4 open, whereby the cross-coupling is activated. At the same time, the wordline WL receives high potential, so that the cell charging is charged on the bitline BL. After the decay of the overcouplings, for the actual evaluation the SAN activation signal is applied to low potential, and somewhat later the SAP activation signal is raised. The advantage of the inventive read amplifier will now be clear in the following. For the case in which the transistor M5 has a lower inception voltage than the transistor M6, the level at the end of the pre-load phase on the bitline BL is higher than on the bitline BLq, which however compensates the better conductivity of this transistor during the evaluation phase. For example, a mismatch of 175 millivolts in the inception voltages of the transistors M5 and M6 still leads to a correct evaluation, while with known read amplifiers a correct evaluation is no longer achieved.

In the data output and equalizing phase, the wordline WL is again switched off, and the datum is subsequently read out with the aid of the column selection signal CSL. After this, given a control signal PhiS already at high potential, the control signal PhiP is raised in order to equalize the levels of the bitlines BL and Blq, and to set them to a value of the SAN activation signal located between 0 volts and a maximum of $VDD/2+V_{t,max}$. In this way, the original state is reproduced.

Figure 3:
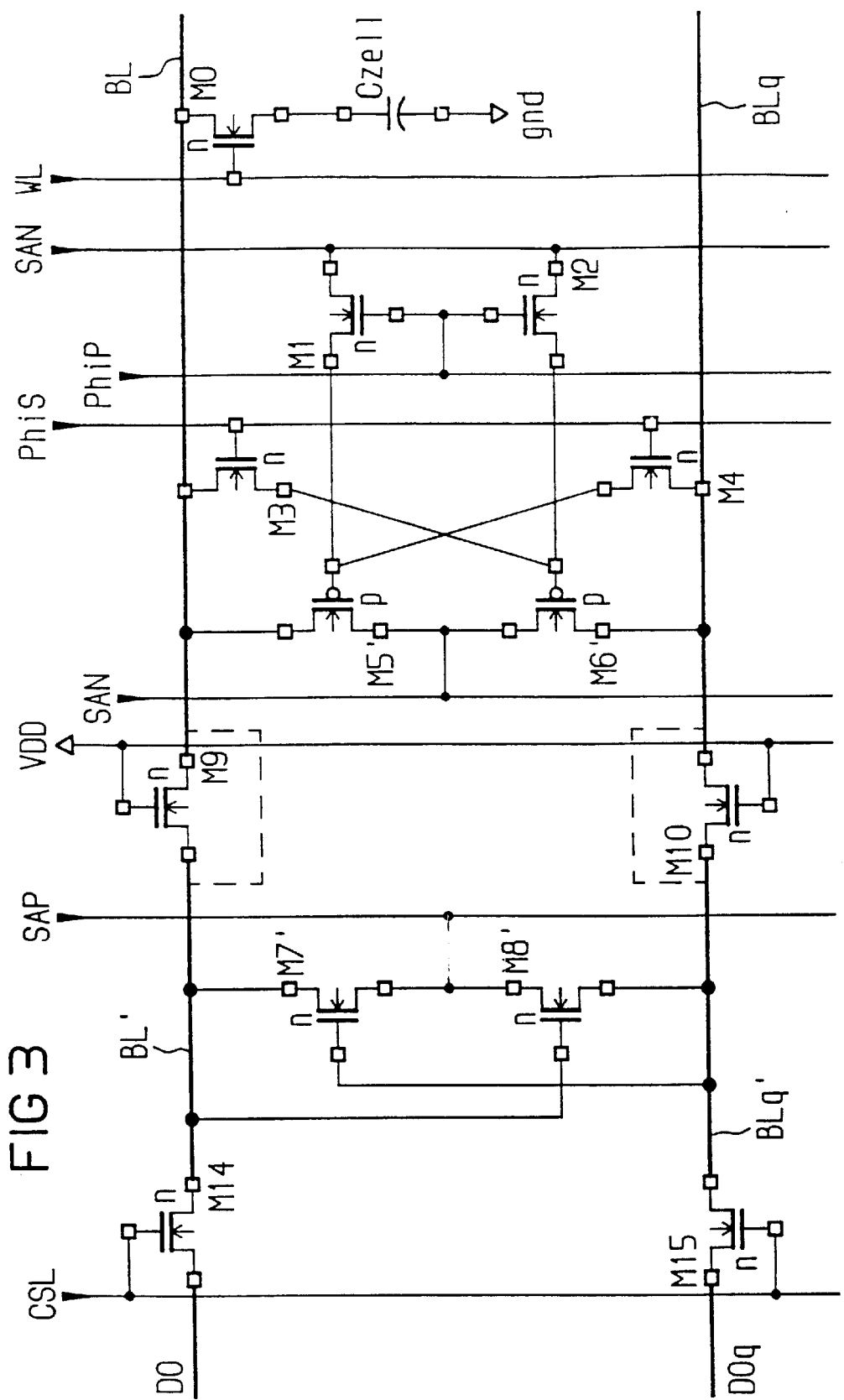
FIG. 3 shows a switching diagram of a second embodiment of the invention.

FIG. 3 shows a further construction of the inventive read amplifier, in which the n-channel transistors M5 and M6 are replaced by p-channel transistors M5' and M6', and the p-channel transistors M7 and M8 are replaced by n-channel transistors M7' and M8', and the SAN and SAP activation lines are exchanged with one another. Furthermore, the transistors M1 to M4 are n-channel MOS transistors, because these have a better conductivity.

FIG. 4 shows the time diagram belonging to FIG. 3, and differs from the signal curves of FIG. 2 only in the SAN and SAP activation signals and in the levels of the bitlines. Here it is to be noted that within the pre-load phase PRE there occurs no step-type drop of the SAN activation signal, but in the SAP activation signal a step-type curve occurs that is mirror-inverted in relation to the curve of the SAN activation signal in FIG. 2. Within the pre-load phase PRE, the voltages of the bitlines BL and BLq differ in turn by $\Delta V_T$, and only the levels of the bitlines are lower, in the state in which the control signal PhiP is high, than in the state in which the control signal PhiP is still low, and in the equalizing phase EQ there results a higher common level than in FIG. 2.

The invention is not limited to the particular details of the apparatus depicted and other modifications and applications are contemplated. Certain other changes may be made in the above described apparatus without departing from the true spirit and scope of the invention herein involved. It is intended, therefor, that the subject matter in the above depiction shall be interpreted as illustrative and not in a limiting sense.

What is claimed is:

1. A semiconductor memory with a read amplifier, comprising:

the read amplifier connected with a bitline pair, whereby a first bitline of the bitline pair is connected with a memory cell and a second bitline of the bitline pair represents a comparison line;

two cross-coupled MOS transistors that form a holding element, said MOS transistors respectively forming a first terminal that is connected with an activation input of the read amplifier, a second terminal of a first of said two MOS transistors connected with the first bitline and a second terminal of a second of said two MOS transistors connected with the second bitline;

two additional MOS transistors, gates of two additional MOS transistors connected with a first control line, and a respective first terminal of said two additional MOS transistors respectively connected with one of the gates of the cross-coupled MOS transistors;

a gate of the first of the cross-coupled MOS transistors connected with the second bitline via a first further MOS transistor, and a gate of the second cross-coupled MOS transistor connected with the first bitline via a second further MOS transistor, gates of the two further MOS transistors connected in common with a second control line; and the additional MOS transistors forming second terminals that are connected in common with the activation input of the read amplifier.

2. The semiconductor memory with a read amplifier according to claim 1, wherein each of the two additional MOS transistors and the two further MOS transistors is an n-channel MOS transistor.

3. The semiconductor memory with a read amplifier according to claim 1, wherein each of the two cross-coupled MOS transistors is an n-channel MOS transistor.

4. The semiconductor memory with a read amplifier according to claim 1, wherein each of the two cross-coupled MOS transistors is a p-channel MOS transistor.

* * * * *